(12) United States Patent
Choi

(10) Patent No.: US 12,396,343 B2
(45) Date of Patent: Aug. 19, 2025

(54) DISPLAY DEVICE AND METHOD OF PROVIDING THE SAME

(71) Applicant: Samsung Display Co., LTD., Yongin-si (KR)

(72) Inventor: Hayoung Choi, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 18/436,325

(22) Filed: Feb. 8, 2024

(65) Prior Publication Data

US 2024/0179977 A1    May 30, 2024

Related U.S. Application Data

(62) Division of application No. 17/716,277, filed on Apr. 8, 2022, now Pat. No. 11,943,980.

(30) Foreign Application Priority Data

Jul. 5, 2021    (KR) .......................... 10-2021-0087977

(51) Int. Cl.
*H10K 59/131*    (2023.01)
*H10K 59/12*    (2023.01)
(Continued)

(52) U.S. Cl.
CPC ......... *H10K 59/131* (2023.02); *H10K 59/873* (2023.02); *H10K 59/1201* (2023.02);
(Continued)

(58) Field of Classification Search
None
See application file for complete search history.

(56) References Cited

U.S. PATENT DOCUMENTS

2015/0163911 A1\* 6/2015 Lee ........................ H10K 71/00
29/831
2016/0181346 A1\* 6/2016 Kwon ................ H10K 59/1213
257/40

(Continued)

OTHER PUBLICATIONS

PTO-0892 Notice(s) of References Cited (1 page) and PTO-1449 Notice(s) indicating references considered by Examiner (4 pages), in related (parent) U.S. Appl. No. 17/716,277.

*Primary Examiner* — Steven B Gauthier
*Assistant Examiner* — E. Rhett Cheek
(74) *Attorney, Agent, or Firm* — CANTOR COLBURN LLP

(57) ABSTRACT

A display device includes a display panel, a circuit board, a first conductive film, first and second lower films, and first and second adhesive layers. The display panel includes a display area and a pad area which includes a first pad part. The circuit board is attached on the display panel and includes a lead part overlapping the first pad part. The first conductive film is between the display panel and the circuit board and electrically connects the first pad part and the lead part to each other. The first and second lower films are attached to the display panel to respectively correspond to the display area and the pad area. A thickness of the second adhesive layer between the display panel and the second lower film is less than a thickness of the first adhesive layer between the display panel and the first lower film.

9 Claims, 15 Drawing Sheets

(51) Int. Cl.
  *H10K 59/80*    (2023.01)
  *H10K 77/10*    (2023.01)
  *H10K 102/00*   (2023.01)
  *H10K 71/00*        (2023.01)

(52) U.S. Cl.
  CPC ............ *H10K 71/00* (2023.02); *H10K 77/111* (2023.02); *H10K 2102/311* (2023.02)

(56) References Cited

U.S. PATENT DOCUMENTS

| | | | |
|---|---|---|---|
| 2017/0263887 A1* | 9/2017 | Han | H10K 50/844 |
| 2017/0323779 A1* | 11/2017 | Um | H01L 27/1262 |
| 2017/0358762 A1* | 12/2017 | Min | H10K 50/84 |
| 2018/0090702 A1* | 3/2018 | Um | H10K 71/00 |
| 2018/0151644 A1* | 5/2018 | Han | H10K 59/871 |
| 2018/0366662 A1* | 12/2018 | Sano | H10K 77/111 |
| 2020/0013987 A1* | 1/2020 | Lee | H10K 50/844 |
| 2022/0384762 A1* | 12/2022 | Wu | B32B 27/36 |

* cited by examiner

DISPLAY DEVICE AND METHOD OF PROVIDING THE SAME

This application is a divisional application of U.S. application Ser. No. 17/716,277 filed Apr. 8, 2022, which claims priority to Korean Patent Application No. 10-2021-0087977, filed on Jul. 5, 2021, and all the benefits accruing therefrom under 35 U.S.C. § 119, which is hereby incorporated by reference for all purposes as if fully set forth herein.

BACKGROUND

1. Field

Embodiments of the invention relate to a display device and method of manufacturing (or providing) the same. More particularly, embodiments of the invention relate to a flexible display device and method of manufacturing (or providing) the same.

2. Description of the Related Art

Flat panel display devices are replacing cathode ray tube display devices as display devices due to their lightweight and thin characteristics. As representative examples of such flat panel display devices, there are liquid crystal display devices and organic light emitting element display devices.

At least a portion of the display device may be bent. Therefore, a visibility of the display device from various angles may be improved, and an area of a non-display region of the display device may be decreased. In a method of manufacturing (or providing) the display device in which at least a portion thereof is bendable, methods for minimizing or reducing damage and manufacturing cost have been studied.

SUMMARY

Embodiments provide a display device with improved reliability.

Embodiments also provide a method of manufacturing (or providing) the display device with improved reliability.

Additional features of the invention will be set forth in the description which follows, and in part will be apparent from the description, or may be learned by practice of the invention.

An embodiment of a display device includes a display panel, a circuit board, a first conductive film, a first lower film, a second lower film, a first adhesive layer, and a second adhesive layer. The display panel includes a display area and a pad area which includes a first pad part. The circuit board is in the pad area on the display panel, and includes a lead part overlapping the first pad part. The first conductive film is between the display panel and the circuit board, and electrically connects the first pad part and the lead part to each other. The first lower film is attached under the display panel to correspond to the display area. The second lower film is attached under the display panel to correspond to the pad area. The first adhesive layer is between the display panel and the first lower film, and has a first thickness. The second adhesive layer is between the display panel and the second lower film, and has a second thickness less than the first thickness.

In an embodiment, the second adhesive layer may have a uniform thickness.

In an embodiment, the second adhesive layer may include the same material as the first adhesive layer.

In an embodiment, the second lower film may be spaced apart from the first lower film, and may include a first side surface adjacent to the first lower film and a second side surface which is opposite to the first side surface. The second adhesive layer may be spaced apart from the first adhesive layer, and may include a first side surface adjacent to the first adhesive layer and a second side surface which is opposite to the first side surface of the second adhesive layer.

In an embodiment, the first side surface of the second adhesive layer may protrude toward the first adhesive layer from the first side surface of the second lower film.

In an embodiment, the first side surface of the second adhesive layer may be curved.

In an embodiment, the second side surface of the second adhesive layer may be aligned with the second side surface of the second lower film.

In an embodiment, the second side surface of the second adhesive layer may be flat.

In an embodiment, the display panel may further include a second pad part in the pad area to be spaced apart from the first pad part. The display device may further include a driving circuit chip and a second conductive film. The driving circuit chip may be in the pad area on the display panel to be spaced apart from the circuit board, and may include a bump part overlapping the second pad part. The second conductive film may be between the display panel and the driving circuit chip, and may electrically connect the second pad part and the bump part to each other.

An embodiment of a method of providing a display device includes a first pressing step, a first attaching step, and a second pressing step. In the first pressing step, a pad area of a display module is pressed. The display module includes a display panel, a first lower film, a second lower film, a first adhesive layer, and a second adhesive layer. The display panel includes a display area and the pad area. The first pad part may be in the pad area. The first lower film is attached under the display panel to correspond to the display area. The second lower film is attached under the display panel to correspond to the pad area. The first adhesive layer is between the display panel and the first lower film, and has a first thickness. The second adhesive layer is between the display panel and the second lower film, and has a thickness the same as the first thickness. In the first attaching step, a first conductive film is attached on the first pad part. In the second pressing step, a circuit board including a lead part is placed on the first conductive film, and the circuit board is pressed to electrically connect the first pad part and the lead part to each other.

In an embodiment, after the first pressing step, the second adhesive layer may have a second thickness less than the first thickness.

In an embodiment, after the second pressing step, the second adhesive layer may have the second thickness.

In an embodiment, after the second pressing step, the second adhesive layer may have a uniform thickness.

In an embodiment, the display panel may further include a second pad part in the pad area to be spaced apart from the first pad part. The method may further include, after the first pressing step, a second attaching step of attaching a second conductive film on the second pad part, and a third pressing step of placing a driving circuit chip including a bump part on the second conductive film and pressing the driving circuit chip to electrically connecting the second pad part and the bump part to each other.

In an embodiment, after the third pressing step, the second adhesive layer may have the second thickness.

In an embodiment, in the second pressing step, the circuit board may be pressed with a first pressure. In the first pressing step, the pad area of the display module may be pressed with a second pressure equal to or greater than the first pressure.

In an embodiment, in the second pressing step, the circuit board may be pressed together with heating the pad area of the display module to a first temperature. In the first pressing step, the pad area of the display module may be pressed together with heating the pad area of the display module to a second temperature equal to or greater than the first temperature.

In an embodiment, the method further include, after the first pressing step, cutting at least a portion of a protrusion of the second adhesive layer in which the second adhesive layer protrudes from the second lower film.

In an embodiment, in the first pressing step, a portion of the pad area overlapping the first pad part may be selectively pressed.

In an embodiment, the circuit board may be disposed in consideration of an elongation of the display panel by the first pressing step.

The method of providing the display device may include a main-pressing step for electrically connecting the circuit board and the driving circuit chip to the display panel through an anisotropic conductive film, and a pre-pressing step performed before the main-pressing step. Accordingly, the adhesive layer in the pad area under the display panel may have a substantially uniform thickness even after the main-pressing step. Accordingly, a connection failure due to a massing of conductive balls in the anisotropic conductive film may be prevented or reduced. Accordingly, a reliability of the display device may be improved.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the invention.

DETAILED DESCRIPTION

Figure 1:
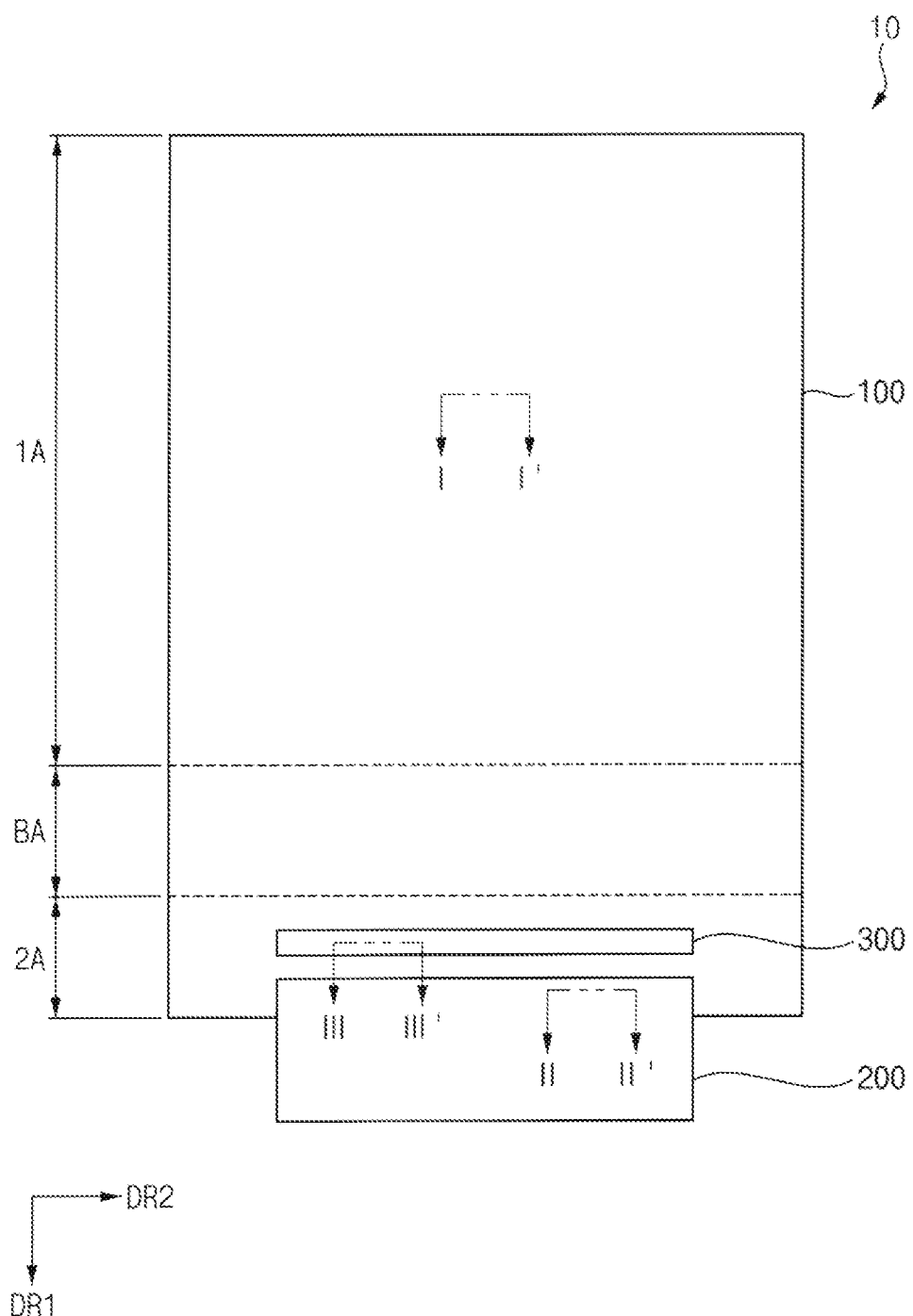
FIGS. 1 and 2 are plan views illustrating an embodiment of a display device.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification It will be understood that when an element is referred to as being "on" another element, it can be directly on the other element or intervening elements may be present therebetween. In contrast, when an element is referred to as being "directly on" another element, there are no intervening elements present. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

Figure 2:
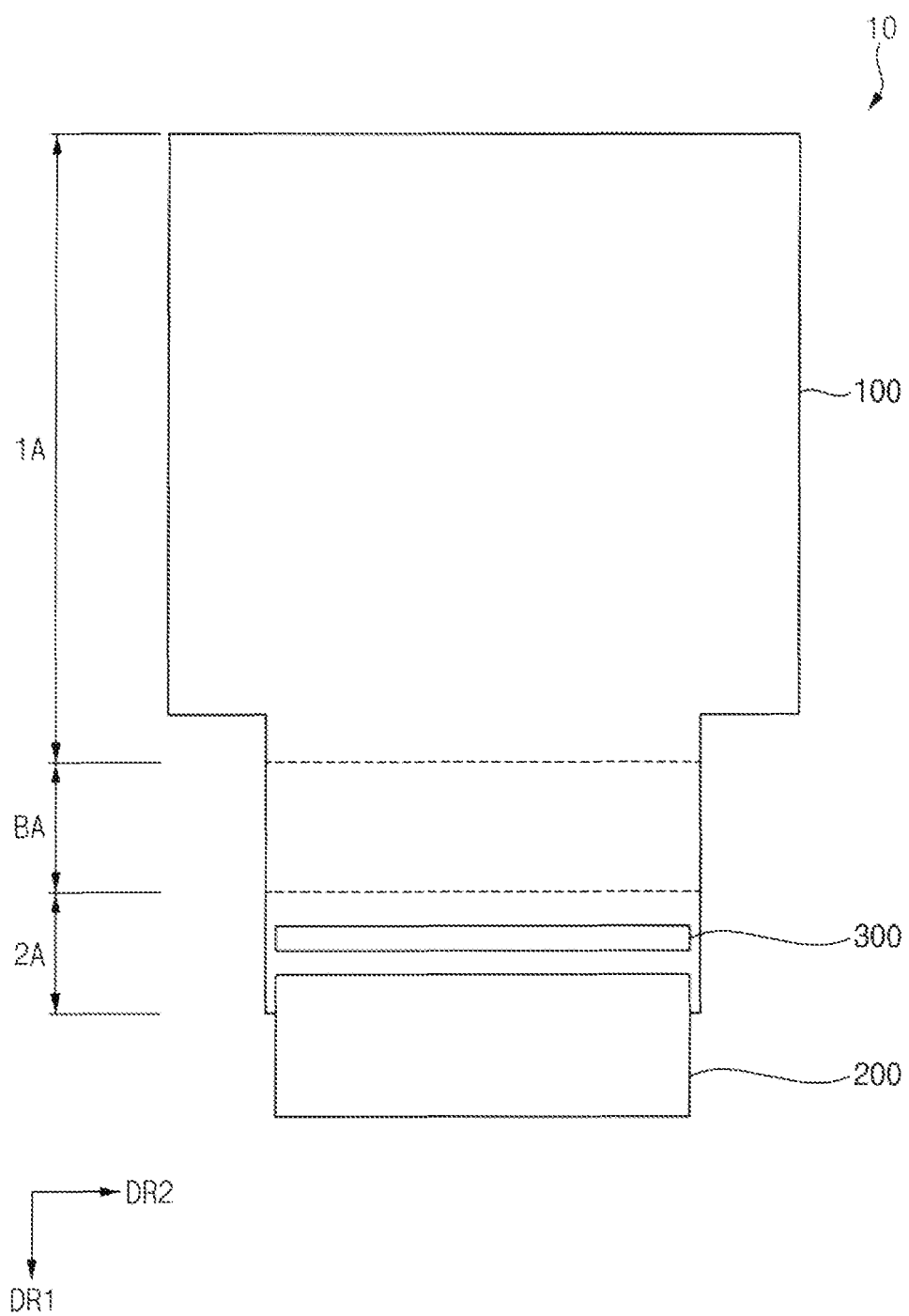
Figure 3:
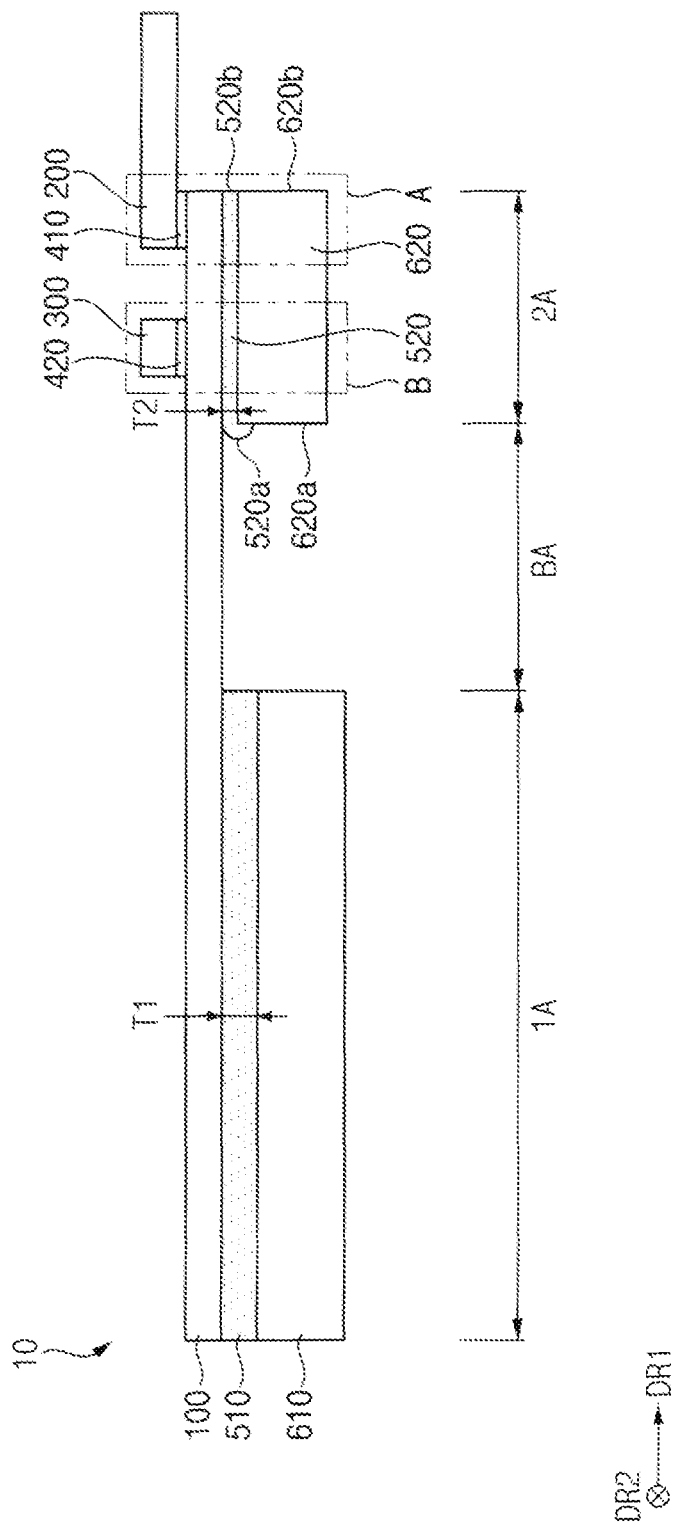
FIGS. 3 and 4 are cross-sectional views illustrating the display device of FIG. 1.
Figure 4:
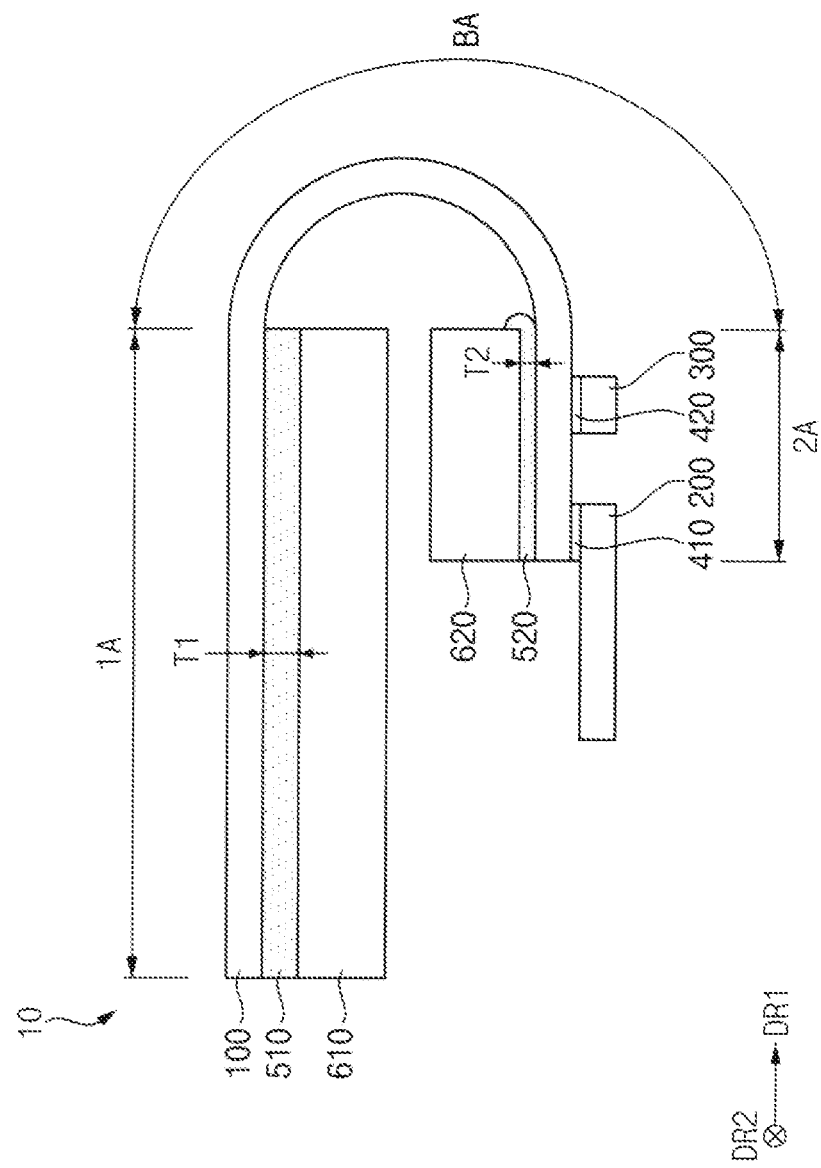
Figure 5:
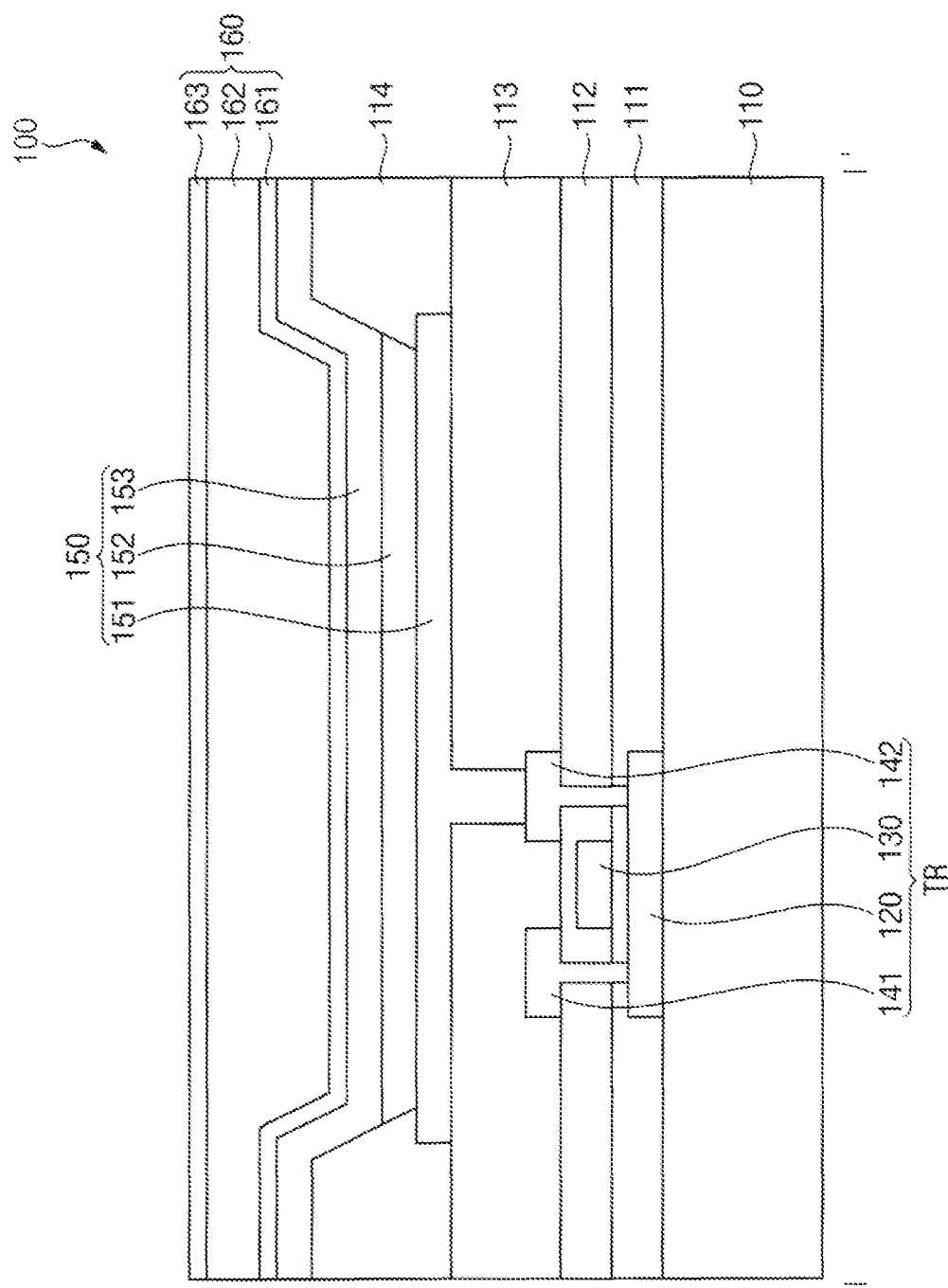
FIG. 5 is a cross-sectional view taken along line I-I' of FIG. 1.

FIGS. 1 and 2 are plan views illustrating embodiments of a display device 10. FIGS. 3 and 4 are cross-sectional views illustrating the display device 10 of FIG. 1. FIG. 5 is a cross-sectional view taken along line I-I' of FIG. 1. In an embodiment, for example, FIG. 4 may illustrate a bent configuration of the display device 10 of FIG. 3.

Referring to FIGS. 1 to 5, a display device 10 may include a display panel 100, a circuit board 200, a driving circuit chip 300, and a lower film.

The display panel 100 may generate or display images. The display panel 100 may include a plurality of pixels for generating the image. Light emitted from each of the pixels may be combined to generate or display images. The display panel 100 may provide the generated image toward an upper surface of the display device 10 (e.g., a display surface).

In an embodiment, the display panel 100 may include (or, may have) a first area 1A, a second area 2A, and a bending area BA. In an embodiment, for example, the second area 2A may be spaced apart from the first area 1A in a first direction DR1. The pixels may be disposed in the first area 1A, and a pad part may be disposed in the second area 2A. In an embodiment, for example, the first area 1A may be referred to as a display area, and the second area 2A may be referred to as a pad area.

The first area 1A, the bending area BA and the second area 2A may be in order along the first direction DR1. The bending area BA may be positioned between the first area 1A and the second area 2A. The bending area BA may be bendable to be bent along a bending axis extending in a second direction DR2 crossing the first direction DR1. In an embodiment, for example, the second direction DR2 may be perpendicular to the first direction DR1.

In an embodiment, as illustrated in FIG. 1, the first area 1A, the bending area BA, and the second area 2A may have substantially the same width in the second direction DR2. That is, the display panel 100 may have an overall rectangular shape in a plan view. The display device 10 (or the display panel 100) which is flat or unbent, may be disposed in a plane defined by the first direction DR1 and the second direction DR2 which cross each other. Various components or layers of the display device 10 may have a first area 1A, a second area 2A, and a bending area BA corresponding to those described above.

In an embodiment, as illustrated in FIG. 2, each of a width of the bending area BA and a width of the second area 2A in the second direction DR2 may be less than a width of the first area 1A in the second direction DR2. In an embodiment, for example, a width of the display panel 100 may be narrowed in a portion of the first area 1A adjacent to the bending area BA (e.g., a portion which is closest to the bending area BA). In an embodiment, for example, the width of the bending area BA in the second direction DR2 may be substantially the same as the width of the second area 2A in the second direction DR2.

In an embodiment, the display panel 100 may include a substrate 110, a transistor TR, a light emitting element 150, an encapsulation layer 160, a first pad part 170, and a second pad part 180. The transistor TR and the light emitting element 150 may be disposed in the first area 1A, on the substrate 110. The first pad part 170 and the second pad part 180 may be disposed in the second area 2A, on the substrate 110.

The substrate 110 may be a flexible and insulating substrate. In an embodiment, for example, the substrate 110 may include (or, may be) a transparent resin substrate. In an embodiment, for example, the substrate 110 may include a polyimide substrate. In this case, the substrate 110 may have a multi-layered structure in which one or more polyimide layer and one or more barrier layer are alternately stacked.

An active layer 120 may be disposed on the substrate 110. The active layer 120 may include an oxide semiconductor, a silicon semiconductor, an organic semiconductor, or the like. In an embodiment, for example, the oxide semiconductor may include at least one oxide of indium (In), gallium (Ga), tin (Sn), zirconium (Zr), vanadium (V), hafnium (Hf), cadmium (Cd), germanium (Ge), chromium (Cr), titanium (Ti), and zinc (Zn). The silicon semiconductor may include an amorphous silicon, a polycrystalline silicon, or the like, but embodiments are not limited thereto. The active layer 120 may include a source area, a drain area, and a channel area which is positioned between the source area and the drain area.

In an embodiment, a buffer layer (not shown) may be disposed between the substrate 110 and the active layer 120. The buffer layer may prevent or reduce instances of impurities diffusing into the active layer 120 from the substrate 110. The buffer layer may include an inorganic insulating material such as a silicon compound, a metal oxide, or the like. Examples of the inorganic insulating material may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), or the like, but embodiments are not limited thereto. These can be used alone or in a combination thereof. The buffer layer may have a single-layered structure or a multi-layered structure including a plurality of insulating layers.

A first insulating layer 111 may be disposed on the active layer 120. The first insulating layer 111 may cover the active layer 120 on the substrate 110. The first insulating layer 111 may include an inorganic insulating material.

A gate electrode 130 may be disposed on the first insulating layer 111. The gate electrode 130 may overlap (or correspond to) the channel area of the active layer 120. The gate electrode 130 may include a conductive material such as a metal, an alloy, a conductive metal nitride, a conductive metal oxide, a transparent conductive material, or the like. Examples of the conductive material may include gold (Au), silver (Ag), aluminum (Al), platinum (Pt), nickel (Ni), titanium (Ti), palladium (Pd), magnesium (Mg), calcium (Ca), lithium (Li), chromium (Cr), tantalum (Ta), tungsten (W), copper (Cu), molybdenum (Mo), scandium (Sc), neodymium (Nd), iridium (Ir), alloys containing aluminum, alloys containing silver, alloys containing copper, alloys containing molybdenum, aluminum nitride (AlN), tungsten nitride (WN), titanium nitride (TiN), chromium nitride (CrN), tantalum nitride (TaN), strontium ruthenium oxide (SrRuO), zinc oxide (ZnO), indium tin oxide (ITO), tin oxide (SnO), indium oxide (InO), gallium oxide (GaO), indium zinc oxide (IZO), or the like, but embodiments are not limited thereto. These can be used alone or in a combination thereof. The gate electrode 130 may have a single-layered structure or a multi-layered structure including a plurality of conductive layers.

A second insulating layer 112 may be disposed on the gate electrode 130. The second insulating layer 112 may cover the gate electrode 130 on the first insulating layer 111. The second insulating layer 112 may include an inorganic insulating material.

A source electrode 141 and a drain electrode 142 may be disposed on the second insulating layer 112. The source electrode 141 and the drain electrode 142 may be connected to the source area and the drain area of the active layer 120, respectively. Each of the source electrode 141 and the drain electrode 142 may include a conductive material. In an embodiment, for example, each of the source electrode 141 and the drain electrode 142 may have a multi-layered structure of Ti/Al/Ti. The active layer 120, the gate electrode 130, the source electrode 141, and the drain electrode 142 may together form the transistor TR.

A third insulating layer 113 may be disposed on the source electrode 141 and the drain electrode 142. The third insulating layer 113 may include an organic insulating material. Examples of the organic insulating material may include a photoresist, a polyacryl-based resin, a polyimide-based resin, a polyamide-based resin, a siloxane-based resin, an acryl-based resin, an epoxy-based resin, or the like, but embodiments are not limited thereto. These can be used alone or in a combination thereof. In an embodiment, the third insulating layer 113 may have a multi-layered structure including at least one organic insulating layer and at least one inorganic insulating layer.

A pixel electrode 151 may be disposed on the third insulating layer 113. The pixel electrode 151 may include a conductive material. The pixel electrode 151 may be connected to the drain electrode 142 through a contact hole formed (or defined) in the third insulating layer 113. Accordingly, the pixel electrode 151 may be electrically connected to the transistor TR.

A fourth insulating layer 114 may be disposed on the pixel electrode 151. The fourth insulating layer 114 may cover a peripheral portion of the pixel electrode 151, and may define a pixel opening exposing a central portion of the pixel electrode 151. The fourth insulating layer 114 may include an organic insulating material.

An emission layer 152 may be disposed on the pixel electrode 151. The emission layer 152 may be disposed in the pixel opening of the fourth insulating layer 114. In some embodiments, the emission layer 152 may include at least one of an organic light emitting material or quantum dot.

In an embodiment, the organic light emitting material may include a low molecular organic compound or a high molecular organic compound. Examples of the low molecular organic compound may include copper phthalocyanine, N,N'-diphenylbenzidine, tris-(8-hydroxyquinoline)aluminum, or the like. Examples of the high molecular organic compound may include poly(3,4-ethylenedioxythiophene), polyaniline, poly-phenylenevinylene, polyfluorene, or the like. These can be used alone or in a combination thereof.

In an embodiment, the quantum dot may include a core including a Group II-VI compound, a Group III-V compound, a Group IV-VI compound, a Group IV element, and/or a Group IV compound. In an embodiment, the quantum dot may have a core-shell structure including the core and a shell surrounding the core. The shell may serve as a protection layer for preventing the core from being chemically denatured to maintain semiconductor characteristics, and may serve as a charging layer for imparting electrophoretic characteristics to the quantum dot.

A counter electrode 153 may be disposed on the emission layer 152. The counter electrode 153 may also be disposed on the fourth insulating layer 114. The counter electrode 153 may include a conductive material. The pixel electrode 151, the emission layer 152, and the counter electrode 153 may together form the light emitting element 150.

An encapsulation layer 160 may be disposed on the counter electrode 153. The encapsulation layer 160 may include at least one inorganic encapsulation layer and at least one organic encapsulation layer. In an embodiment, the encapsulation layer 160 may include a first inorganic encapsulation layer 161 disposed on the counter electrode 153, an organic encapsulation layer 162 disposed on the first inorganic encapsulation layer 161, and a second inorganic encapsulation layer 163 disposed on the organic encapsulation layer 162.

In an embodiment, a first end portion of the circuit board 200 may be connected to an end portion (e.g., an end portion in the first direction DR1 or distal end) of the display panel 100. In an embodiment, for example, the circuit board 200 may be attached to the display panel 100 by a first conductive film 410, and may be electrically connected to the first pad part 170 of the display panel 100 by the first conductive film 410. This will be described later in detail.

The circuit board 200 may be a flexible printed circuit board (FPCB). A printed circuit board (PCB) (not illustrated) may be attached on a second end portion of the circuit board 200 which is opposite to the first end portion.

In an embodiment, the driving circuit chip 300 may be disposed in the second area 2A, on the display panel 100, to be spaced apart from the circuit board 200. In an embodiment, for example, the driving circuit chip 300 may be disposed in the second area 2A, on the display panel 100, to be spaced apart from the circuit board 200 in a direction opposite to the first direction DR1. That is, the driving circuit chip 300 may be directly mounted on the display panel 100 in a chip on plastic (COP) method. In an embodiment, for example, the driving circuit chip 300 may be attached on the display panel 100 by a second conductive film 420, and may be electrically connected to the second pad part 180 of the display panel 100 by the second conductive film 420. This will be described later in detail.

In an embodiment, the driving circuit chip 300 may be mounted on the circuit board 200 connected to the display panel 100, in a chip on film (COF) method.

The circuit board 200, the driving circuit chip 300, and the PCB may provide a driving signal to the display panel 100. The driving signal may include various signals (e.g., electrical signals) for driving the display panel 100 such as driving voltage, a gate signal, a data signal, or the like.

The lower film may be disposed under the display panel 100 (e.g., the substrate 110) to protect the display panel 100 from external impact. The lower film may be attached to a lower surface of the display panel 100 (e.g., the substrate 110) by an adhesive layer. The lower film may be attached to the display panel 100 at a lower surface of the substrate 110, without being limited thereto.

In an embodiment, the lower film may include a first lower film 610 and a second lower film 620 that are spaced apart from each other (e.g., disconnected from each other at the bending area BA). The first lower film 610 may be attached to the lower surface of the display panel 100 to correspond to the first area 1A. The second lower film 620 may be attached to the lower surface of the display panel 100 to correspond to the second area 2A. That is, the second lower film 620 may be spaced apart from the first lower film 610 in the first direction DR1 with the bending area BA interposed therebetween.

The first lower film 610 and the second lower film 620 may include a substantially same material. In an embodiment, for example, each of the first lower film 610 and the second lower film 620 may include a polymer material. Examples of the polymer material may include polyethylene terephthalate (PET), polyethylene naphthalene (PEN), polypropylene (PP), polycarbonate (PC), polystyrene (PS), polysulfone (PSul), polyethylene (PE), polyphthalamide (PPA), polyethersulfone (PES), polyarylate (PAR), polycarbonate oxide (PCO), modified polyphenylene oxide (MPPO), or the like, but embodiments are not limited thereto. These can be used alone or in a combination thereof.

The first lower film 610 may be attached to the lower surface of the display panel 100 by a first adhesive layer 510, and the second lower film 620 may be attached to the lower surface of the display panel 100 by a second adhesive layer 520. That is, the first adhesive layer 510 may be disposed between the display panel 100 and the first lower film 610, and may correspond to the first area 1A. The second adhesive layer 520 may be disposed between the display panel 100 and the second lower film 620, and may correspond to the second area 2A. The second adhesive layer 520 may be spaced apart from the first adhesive layer 510 (e.g., disconnected from the first adhesive layer 510) in the first direction DR1 with the bending area BA interposed therebetween.

The first adhesive layer 510 and the second adhesive layer 520 may include a substantially same material. In an embodiment, for example, each of the first adhesive layer 510 and the second adhesive layer 520 may include (or, may be) a pressure sensitive adhesive (PSA), an optical clear adhesive (OCA), an optical clear resin (OCR), or the like.

In an embodiment, the first adhesive layer 510 may have a first thickness T1, and the second adhesive layer 520 may have a second thickness T2 which is less than the first thickness T1. In an embodiment, for example, the first thickness T1 may mean an average thickness of the first adhesive layer 510, and the second thickness T2 may mean an average thickness of the second adhesive layer 520.

In an embodiment, the second adhesive layer 520 may have a substantially uniform thickness.

The second lower film 620 may include (or, may have) a first side surface 620a adjacent to (or closest to) the first lower film 610 and a second side surface 620b which is opposite to the first side surface 620a. The second adhesive layer 520 may include (or, may have) a first side surface 520a adjacent to or closest to the first adhesive layer 510 and a second side surface 520b which is opposite to the first side surface 520a.

In an embodiment, as illustrated in FIG. 3, the first side surface 520a of the second adhesive layer 520 may protrude from the first side surface 620a of the second lower film 620 in the direction opposite to the first direction DR1 (e.g., toward the first adhesive layer 510), to dispose the first side surface 520a of the second adhesive layer 520 spaced apart from the first side surface 620a of the second lower film 620. The second adhesive layer 520 may protrude further from the first side surface 620a of the second lower film 620, to define a protruded portion or protrusion of the second adhesive layer 520. The first side surface 520a of the second adhesive layer 520 may be curved. In contrast, the second side surface 520b of the second adhesive layer 520 may be aligned with (or coplanar with) the second side surface 620b of the second lower film 620. The second side surface 520b of the second adhesive layer 520 may be flat.

In an embodiment, the second side surface 520b of the second adhesive layer 520 may protrude from the second side surface 620b of the second lower film 620 in the first direction DR1. The second side surface 520b of the second adhesive layer 520 may be curved.

Figure 6:
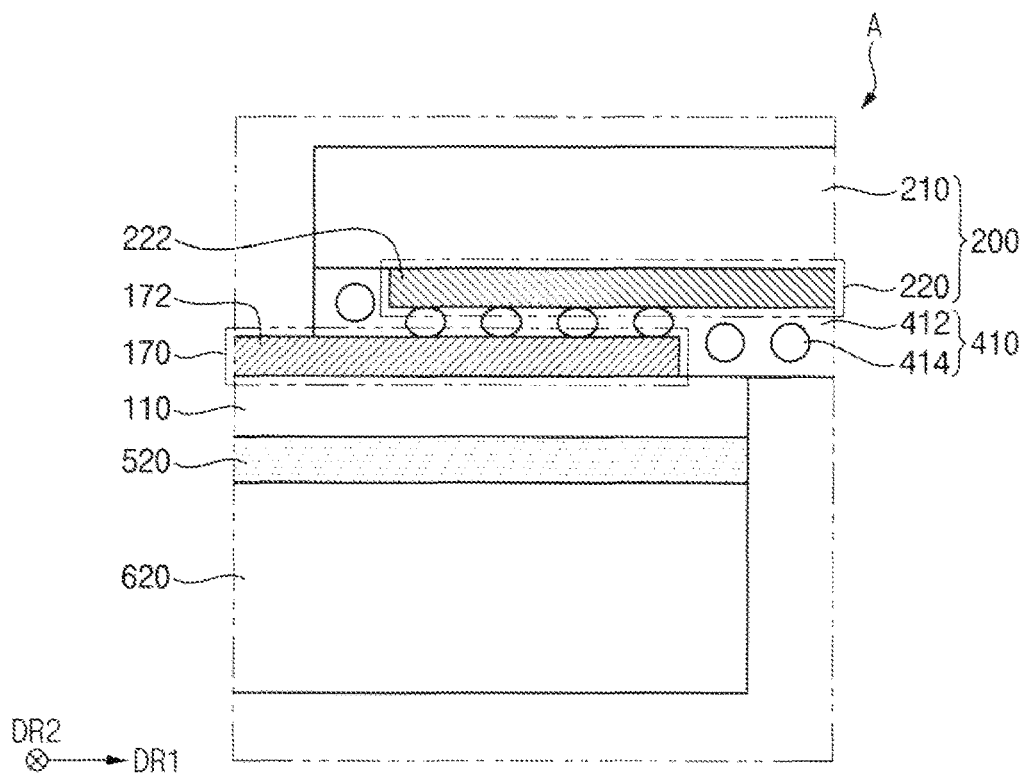
FIG. 6 is an enlarged cross-sectional view of area 'A' of FIG. 3.
Figure 7:
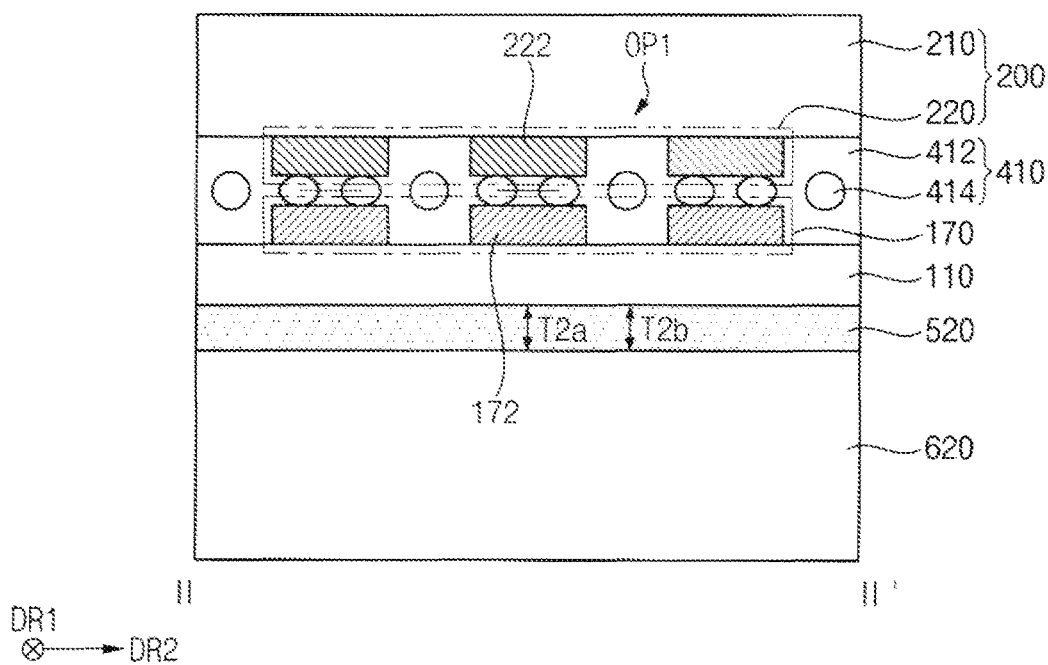
FIG. 7 is a cross-sectional view taken along line II-II' of FIG. 1.

FIG. 6 is an enlarged cross-sectional view of area 'A' of FIG. 3. FIG. 7 is a cross-sectional view taken along line II-II' of FIG. 1.

Referring to FIGS. 1, 3, 6, and 7, in an embodiment, the first pad part 170 disposed in the second area 2A on the substrate 110 may include a first pad electrode 172 provided in plural including a plurality of first pad electrodes 172 arranged in the second direction DR2. In an embodiment, for example, each of the first pad electrodes 172 may be disposed in a same layer as the source electrode 141 and the drain electrode 142. As used herein, elements which are in a same layer as each other may be respective patterns of a same material layer on the substrate 110, without being limited thereto. In an embodiment, for example, each of the first pad electrodes 172 may have a multi-layered structure of Ti/Al/Ti.

The circuit board 200 may include a first base substrate 210 and a lead part 220. The lead part 220 may include a lead terminal 222 provided in plural including a plurality of lead terminals 222 arranged in the second direction DR2. The circuit board 200 may be attached to the display panel 100 such that the lead part 220 overlaps the first pad part 170.

The first conductive film 410 may be disposed between the display panel 100 and the circuit board 200. The first conductive film 410 may include a film layer 412 and a plurality of conductive balls 414. In an embodiment, for example, the first conductive film 410 may be an anisotropic conductive film (ACF).

The first pad part 170 of the display panel 100 and the lead part 220 of the circuit board 200 may be electrically connected to each other by the first conductive film 410. In an embodiment, for example, the first pad electrodes 172 may be electrically connected to the corresponding ones of the lead terminals 222 by the conductive balls 414, respectively.

In an embodiment, the second adhesive layer 520 may have a substantially uniform thickness. In an embodiment, for example, as illustrated in FIG. 7, a thickness T2a of a first portion of the second adhesive layer 520 overlapping each of the first pad electrodes 172 may be substantially the same as a thickness T2b of a second portion of the second adhesive layer 520 overlapping a first opening OP1 between two adjacent first pad electrodes 172.

Figure 8:
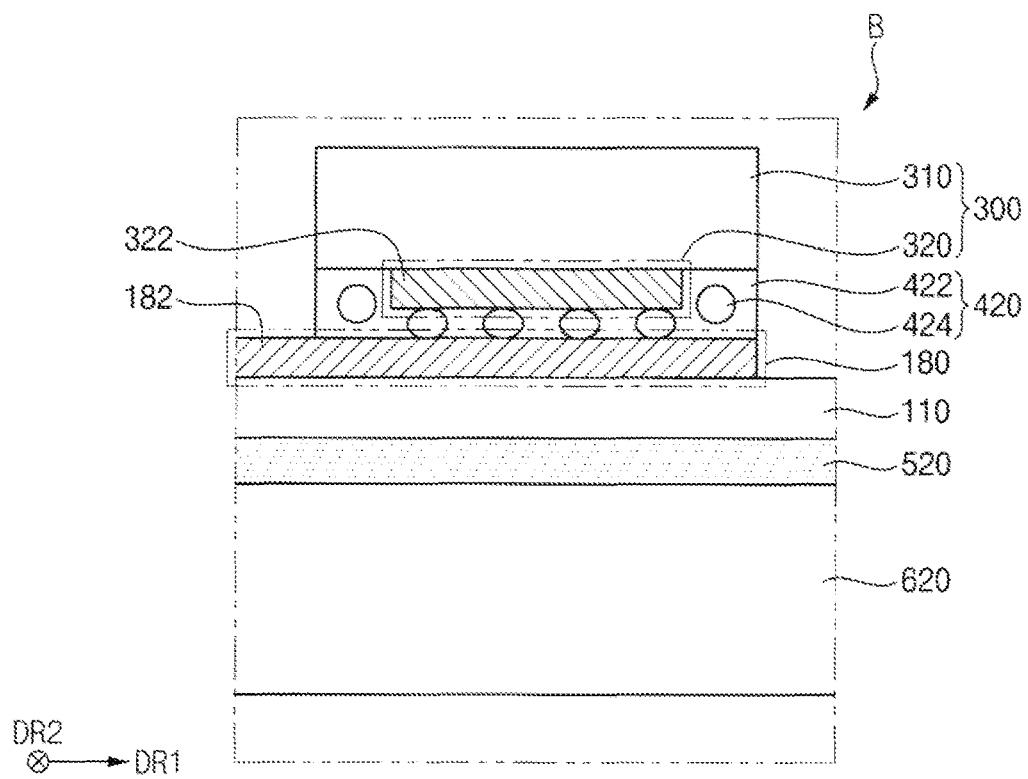
FIG. 8 is an enlarged cross-sectional view of area 'B' of FIG. 3.
Figure 9:
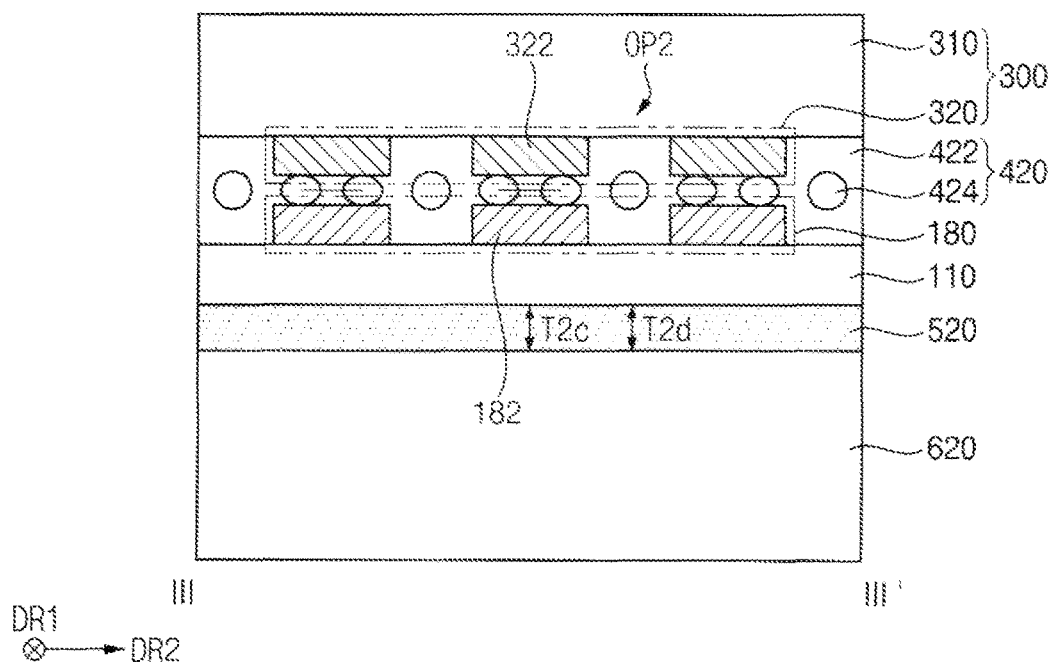
FIG. 9 is a cross-sectional view taken along line III-III' of FIG. 1.

FIG. 8 is an enlarged cross-sectional view of area 'B' of FIG. 3. FIG. 9 is a cross-sectional view taken along line III-III' of FIG. 1.

Referring to FIGS. 1, 3, 8, and 9, in an embodiment, the second pad part 180 disposed in the second area 2A, on the substrate 110, may include a second pad electrode 182 provided in plural including a plurality of second pad electrodes 182 arranged in the second direction DR2. The second pad part 180 may be spaced apart from the first pad part 170 in the direction opposite to the first direction DR1. In an embodiment, for example, each of the second pad electrodes 182 may be disposed in a same layer as the source electrode 141 and the drain electrode 142. In an embodiment, for example, each of the second pad electrodes 182 may have a multi-layered structure of Ti/Al/Ti.

The driving circuit chip 300 may include a second base substrate 310 and a bump part 320. The bump part 320 may include a bump electrode 322 provided in plural including a plurality of bump electrodes 322 arranged in the second direction DR2. The driving circuit chip 300 may be attached to the display panel 100 such that the bump part 320 overlaps the second pad part 180.

The second conductive film 420 may be disposed between the display panel 100 and the driving circuit chip 300. The second conductive film 420 may include a film layer 422 and a plurality of conductive balls 424. In an embedment, for example, the second conductive film 420 may have substantially the same configuration as the first conductive film 410.

The second pad part 180 and the bump part 320 may be electrically connected to each other by the second conductive film 420. In an embodiment, for example, the second pad electrodes 182 may be electrically connected to the corresponding ones of the bump electrodes 322 by the conductive balls 424, respectively.

In an embodiment, the second adhesive layer 520 may have a substantially uniform thickness. In an embodiment, for example, as illustrated in FIG. 9, a thickness T2c of a third portion of the second adhesive layer 520 overlapping each of the second pad electrodes 182 may be substantially the same as a thickness T2d of a fourth portion of the second adhesive layer 520 overlapping a second opening OP2 between two adjacent second pad electrodes 182. In an embodiment, for example, the thickness T2a of the first portion of the second adhesive layer 520, the thickness T2b of the second portion of the second adhesive layer 520, the thickness T2c of the third portion of the second adhesive layer 520, and the thickness T2d of the fourth portion of the second adhesive layer 520 may be substantially the same. Accordingly, a connection failure between the first pad part 170 and the lead part 220 due to a massing of the conductive balls 414 or a connection failure between the second pad part 180 and the bump part 320 due to a massing of the conductive balls 424 may be prevented or reduced. Accordingly, a reliability of the display device 10 may be improved.

FIGS. 10 to 15 are cross-sectional views illustrating an embodiment of a method of manufacturing (or providing) the display device 10 of FIG. 1.

Figure 10:
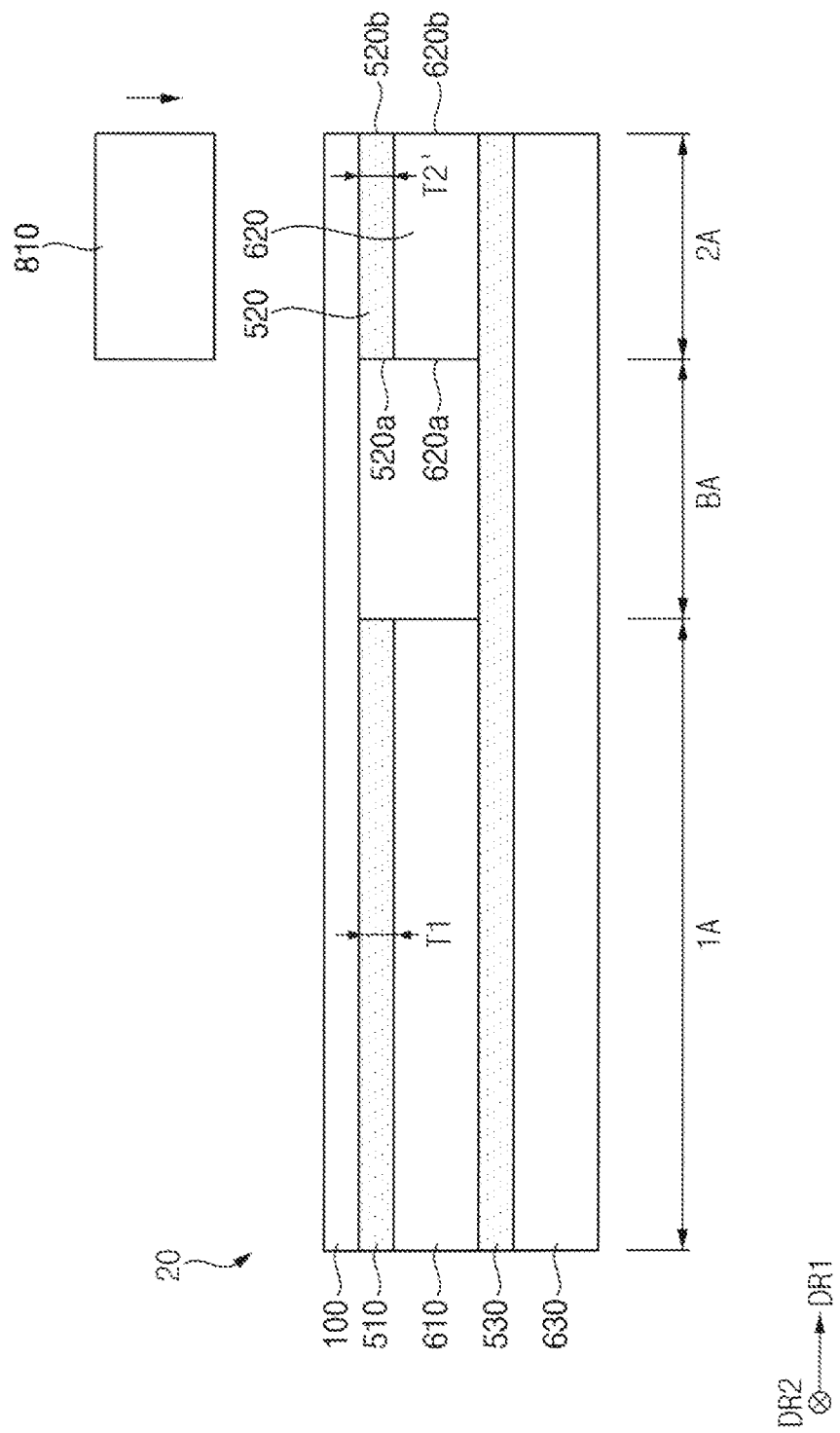
FIGS. 10 to 15 are cross-sectional views illustrating embodiments of processes in a method of providing the display device of FIG. 1.

Referring to FIG. 10, a display module 20 including the display panel 100, the first adhesive layer 510, the second adhesive layer 520, the first lower film 610, and the second lower film 620 may be prepared. In an embodiment, for example, the display module 20 may be a semi-finished product of the display device 10. The display panel 100, the first adhesive layer 510, the second adhesive layer 520, the first lower film 610, and the second lower film 620 may be the same as or similar to those described with reference to FIGS. 1 to 9, therefore, repeated descriptions will be omitted or simplified.

In an embodiment, the display module 20 may further include a third lower film 630 and a third adhesive layer 530. The third lower film 630 may be commonly attached to a lower surface of the first lower film 610 and a lower surface of the second lower film 620 by the third adhesive layer 530 to correspond to an entirety of the first area 1A, the second area 2A, and the bending area BA. The third lower film 630 may protect the display panel 100 from an external impact during a process of manufacturing or providing the display device 10, or may maintain a shape of the display module 20. As will be described later, the third lower film 630 and the third adhesive layer 530 may be separated from the first lower film 610 and the second lower film 620 before the display panel 100 is bent. That is, the third lower film 630 and the third adhesive layer 530 are removably attached to the first lower film 610 and the second lower film 620.

The first adhesive layer 510 and the second adhesive layer 520 may include a substantially same material. The first adhesive layer 510 may have a first thickness T1. The second adhesive layer 520 may have a thickness T2' (e.g., preliminary thickness) that is substantially the same as the first thickness T1.

Figure 11:
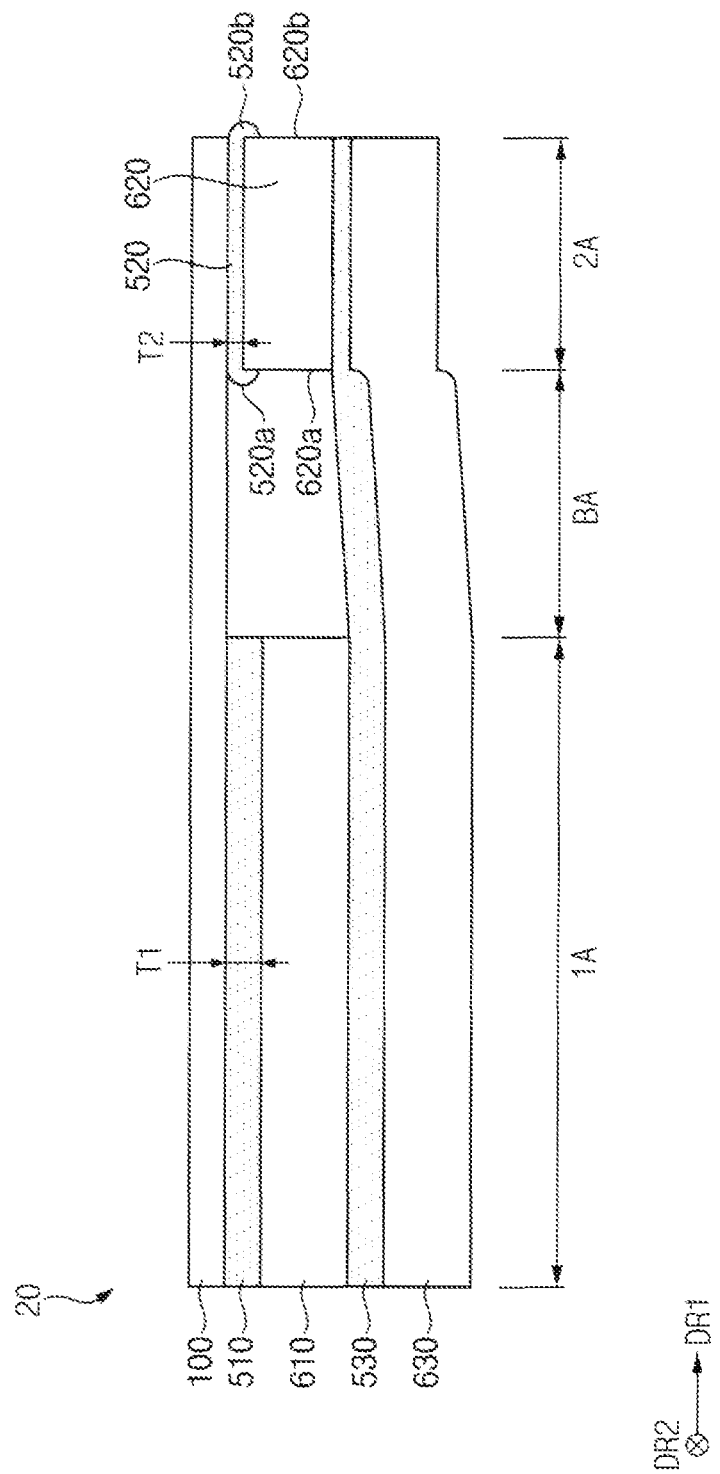

Referring to FIGS. 10 and 11, the second area 2A of the display module 20 may be pre-pressed using a pressing device 810. The pre-pressing step (e.g., a first pressing step) may be a pressing step for pre-deforming the second adhesive layer 520 (e.g., deform the second adhesive layer 520) before a main-pressing step (e.g., second and third pressing steps) for electrically connecting the circuit board 200 and the driving circuit chip 300 to the display panel 100 (in FIG. 13).

As described above with reference to FIGS. 6 to 9, the first pad part 170 and the lead part 220 may be electrically connected to each other by the first conductive film 410, and the second pad part 180 and the bump part 320 may be electrically connected to each other by the second conductive film 420. In an embodiment, for example, the first pad electrodes 172 may be electrically connected to the corresponding ones of the lead terminals 222 by the conductive balls 414, respectively. The second pad electrodes 182 may be electrically connected to the corresponding ones of the bump electrodes 322 by the conductive balls 424, respectively. In this case, when each of the first pad electrodes 172 and each of the second pad electrodes 182 have a multi-layered structure of Ti/Al/Ti, a portion of the upper Ti layer may be easily oxidized to form an insulating oxide layer (TiO). Therefore, in the main-pressing step, the circuit board 200 and the driving circuit chip 300 may be respectively main-pressed with a predetermined pressure (hereinafter, referred to as a first pressure) required for the conductive balls 414 and 424 to break the insulating oxide layer and connect with the conductive Ti layer, so that the first pad part 170 and the lead part 220 may be electrically connected and the second pad part 180 and the bump part 320 may be electrically connected. In addition, when the film layers 412 and 422 include a thermo-curable resin, in the main-pressing step, the circuit board 200 and the driving circuit chip 300 may be respectively main-pressed while heating the second area 2A of the display module 20 to a predetermined temperature (hereinafter, referred to as a first temperature) required to cure the film layers 412 and 422.

When the main-pressing step is performed without the pre-pressing step, the second adhesive layer 520 under the circuit board 200 may be deformed. In an embodiment, for example, the second adhesive layer 520 may be deformed such that the thickness T2a of the first portion of the second adhesive layer 520 overlapping each of the first pad electrodes 172 is less than the thickness T2' which is before deformation, and the thickness T2b of the second portion of the second adhesive layer 520 overlapping the first opening OP1 between two adjacent first pad electrodes 172 is greater than the thickness T2' which is before deformation. In addition, the second adhesive layer 520 may be deformed such that the thickness T2c of the third portion of the second adhesive layer 520 overlapping each of the second pad electrodes 182 is less than the thickness T2' which is before deformation, and the thickness T2d of the fourth portion of the second adhesive layer 520 overlapping a second opening OP2 between two adjacent second pad electrodes 182 is greater than the thickness T2' which is before deformation. Accordingly, the connection failure between the first pad part 170 and the lead part 220 due to the massing of the conductive balls 414 or the connection failure between the second pad part 180 and the bump part 320 due to the massing of the conductive balls 424 may occur.

However, as illustrated in FIGS. 10 and 11, embodiments of the method of manufacturing (or providing) the display device 10 may include the pre-pressing step (FIG. 10) performed before the main-pressing step. By the pre-pressing step, the second adhesive layer 520 may be pre-deformed to have the second thickness T2 (e.g., reduced thickness) that is less than the thickness T2' which is before deformation. That is, the second adhesive layer 520 which is pre-deformed to have the second thickness T2 may provide a pre-pressed display module including a pre-pressed adhesive layer. The method may include providing first pressing of the second adhesive layer 520 which has the preliminary thickness to form a pre-pressed display module including the first pad part 170.

In an embodiment, in the pre-pressing step, the second area 2A of the display module 20 may be pressed with a second pressure equal to or greater than the first pressure (e.g., the pressure applied in the main-pressing step). In addition, in the pre-pressing step, the second area 2A of the display module 20 may be pressed while heating the second area 2A of the display module 20 to a second temperature equal to or greater than the first temperature (e.g., the temperature of the heat applied in the main-pressing step). Accordingly, deformation of the second adhesive layer 520 which is pre-deformed to have the second thickness T2 by the pre-pressing step (e.g., pre-deformed adhesive layer) may be minimal even when the first pressure and heat having the first temperature are applied in the main-pressing step performed after the pre-pressing step.

In an embodiment, in the pre-pressing step, the second area 2A of the display module 20 may be pressed as a whole, that is, across an entire planar area of the second area 2A (e.g., planar area defined along the first direction DR1 and the second direction DR2). After the pre-pressing step, the second adhesive layer 520 may have a substantially uniform thickness.

In an embodiment, in the pre-pressing step, only portions of the second area 2A of the display module 20 respectively overlapping the first pad part 170 and the second pad part 180 among areas of the second area 2A of the display module 20 may be selectively pressed. That is, the pre-pressing step may be selectively performed on a planar area to which pressure and heat are applied in the main-pressing step performed later. In an embodiment, the pre-pressing step (e.g., first pressing) may be selectively performed at areas corresponding to the first pad part 170 and the second pad part 180 among areas of the second area 2A of the display module 20. As being selectively pressed, the first pressing may include pressing only a portion of the second adhesive layer 520 which corresponds to the first pad part 170 of the display panel 100.

In an embodiment, as illustrated in FIG. 11, a portion of the second adhesive layer 520 may protrude outwardly from the second lower film 620 by the pre-pressing step. That is, the second adhesive layer 520 may include a protrusion protruding outwardly from the second lower film 620. In an embodiment, for example, the protrusion may surround the second lower film 620 in a plan view.

In an embodiment, for example, the first side surface 520a of the second adhesive layer 520 may protrude from the first side surface 620a of the second lower film 620 in the direction opposite to the first direction DR1. The first side surface 520a of the second adhesive layer 520 may be curved. In addition, the second side surface 520b of the second adhesive layer 520 may protrude from the second side surface 620b of the second lower film 620 in the first direction DR1. The second side surface 520b of the second adhesive layer 520 may be curved.

Figure 12:
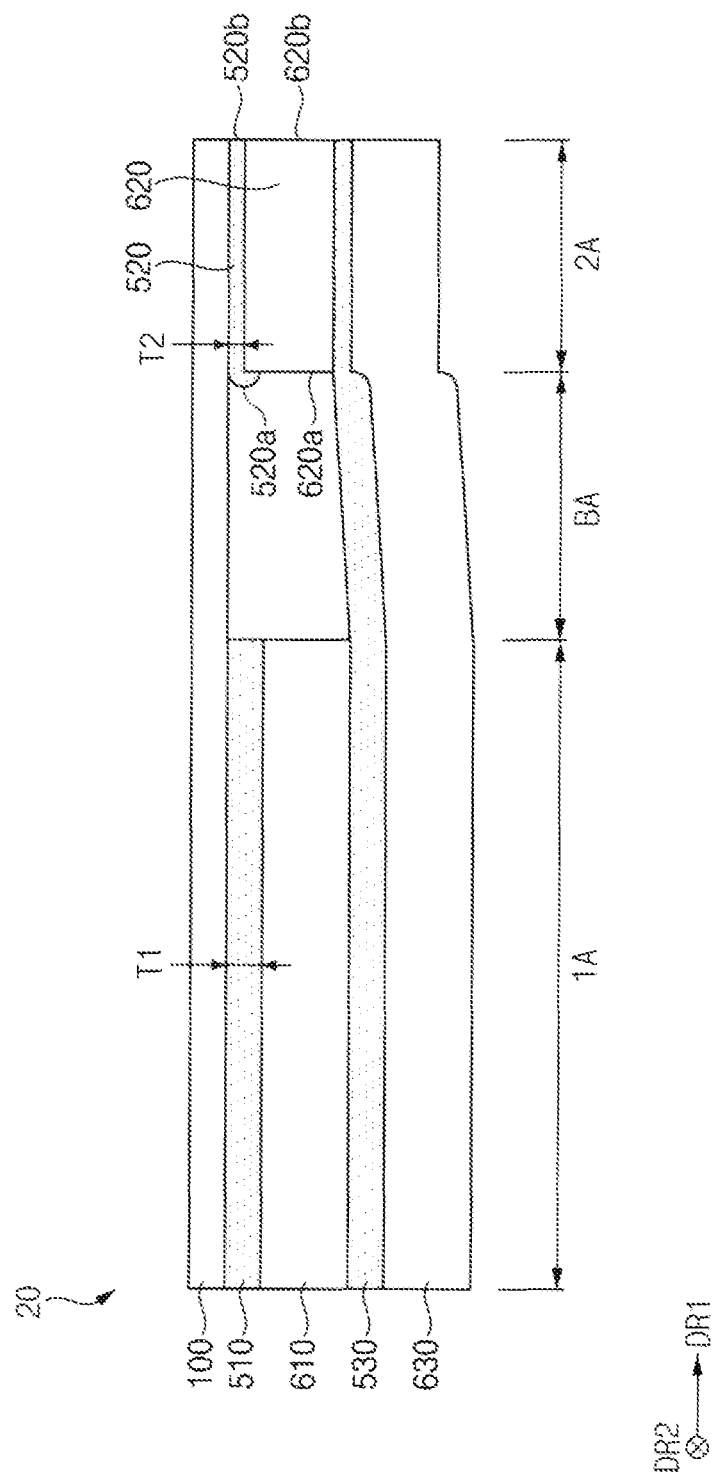

Referring to FIG. 12, in an embodiment, at least a portion of the protrusion of the second adhesive layer 520 may be removed (e.g., may be cut).

In an embodiment, for example, a portion of the protrusion that does not overlap the display panel 100 in a plan view (e.g., a portion protruding from the second lower film 620 in the first direction DR1, the second direction DR2, or a direction opposite to the second direction DR2) may be removed. Accordingly, the second side surface 520b of the second adhesive layer 520 may be aligned with the second side surface 620b of the second lower film 620. The second side surface 520b of the second adhesive layer 520 may each be flat so as to be coplanar with each other.

A portion of the protrusion that overlaps the display panel 100 in a plan view (e.g., a portion protruding from the second lower film 620 in the direction opposite to the first direction DR1) may not be removed. Accordingly, the first side surface 520a of the second adhesive layer 520 may remain protruded from the first side surface 620a of the second lower film 620 in the direction opposite to the first direction DR1. The first side surface 520a of the second adhesive layer 520 may be curved.

When the main-pressing step is performed without the pre-pressing step, as the second adhesive layer 520 is deformed after the main-pressing step, a portion of the second adhesive layer 520 may protrude outwardly from the second lower film 620. In this case, it may be difficult to remove the protrusion of the second adhesive layer 520 due to the circuit board 200 attached on the display panel 100.

However, one or more embodiment of the method of manufacturing or providing the display device 10 may include the pre-pressing step performed before the main-pressing step. Accordingly, as the second adhesive layer 520 is pre-deformed after the pre-pressing step (e.g., before the circuit board 200 is attached on the display panel 100), a portion of the second adhesive layer 520 may protrude outwardly from the second lower film 620 and be exposed to outside the display module 20. Accordingly, the protrusion of the second adhesive layer 520 may be easily removed. Accordingly, a defect of the display device 10 due to the protrusion may be prevented or reduced. Accordingly, the reliability of the display device 10 may be improved.

Figure 13:
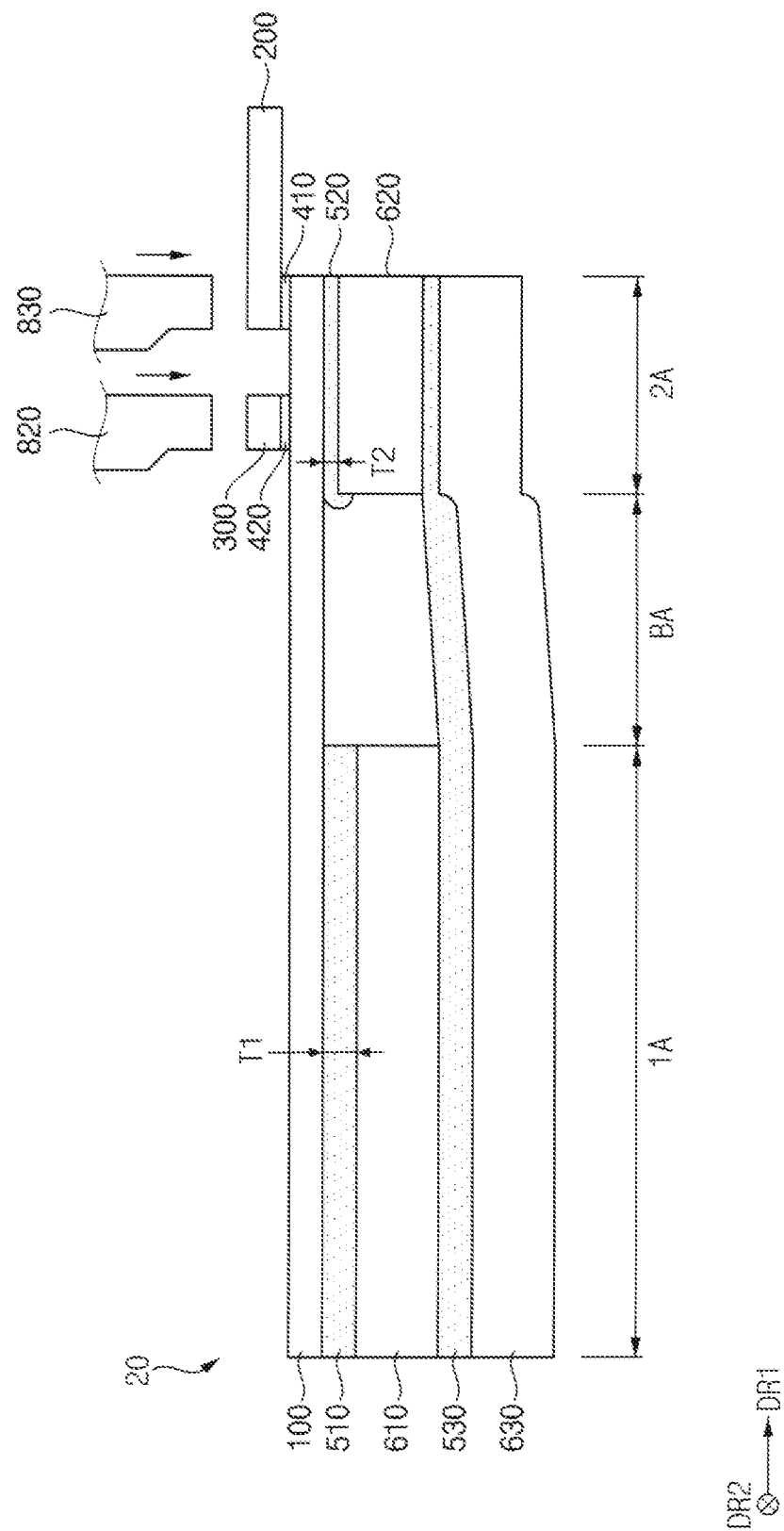

Referring to FIG. 13, the circuit board 200 and the driving circuit chip 300 may be attached to the second area 2A of the display module 20.

The first conductive film 410 and the second conductive film 420 may be attached on the second area 2A of the display module 20. Subsequently, the driving circuit chip 300 may be placed on the second conductive film 420 such that the bump part 320 overlaps the second pad part 180, and the circuit board 200 may be placed on the first conductive film 410 such that the lead part 220 overlaps the first pad part 170.

In an embodiment, the driving circuit chip 300 may be placed on the second conductive film 420 such that the bump part 320 overlaps the second pad part 180 in consideration of an elongation of the display panel 100 by the pre-pressing step. That is, the driving circuit chip 300 may be placed on the second conductive film 420 such that the bump part 320 overlaps the second pad part 180 of the display panel 100 which is unbent or flat. In addition, the circuit board 200 may be placed on the first conductive film 410 such that the lead part 220 overlaps the first pad part 170 in consideration of the elongation of the display panel 100 by the pre-pressing step. That is, the display panel 100 is bendable, the pre-pressed display module further includes the display panel 100 which is unbent, and the providing of the circuit board 200 includes disposing the lead part 220 facing the first pad part 170 of the display panel 100 which is unbent. As such, each of the driving circuit chip 300 and the circuit board 200 may be attached on the display panel 100 to be more precisely aligned. Accordingly, a connection failure between the first pad part 170 and the lead part 220 due to misalignment between the first pad part 170 and the lead part 220 or a connection failure between the second pad part 180 and the bump part 320 due to misalignment between the second pad part 180 and the bump part 320 may be prevented or reduced. Accordingly, the reliability of the display device 10 may be improved.

In the main-pressing step, the driving circuit chip 300 and the circuit board 200 may be respectively main-pressed with the first pressure using pressing devices 820 and 830. In an embodiment, when the film layers 412 and 422 include a thermo-curable resin, in the main-pressing step, the circuit board 200 and the driving circuit chip 300 may be respectively main-pressed while heating the second area 2A of the display module 20 to the first temperature. With respect to the pressing devices 820 and 830, for example, the method may include providing second pressing of the second adhesive layer 520 to electrically connect the first pad part 170 of the display panel 100 to the lead part 220 of the circuit board 200 by the first conductive film 410 and providing third pressing of the second adhesive layer 520 to electrically connect the second pad part 180 of the display panel 100 to the bump part 320 of the driving circuit chip 300 by the second conductive film 420.

The first pressure may be equal to or less than the second pressure, and the first temperature may be equal to or less than the second temperature. That is, the second pressing may include pressing the second adhesive layer 520 together with heating the pad area of the display module 20 to a first temperature, and the first pressing may include pressing the second adhesive layer 520 together with heating the pad area of the display module 20 to a second temperature equal to or greater than the first temperature. Accordingly, the second adhesive layer 520 pre-deformed to have the second thickness T2 by the pre-pressing step may be hardly deformed even when the first pressure and heat having the first temperature are applied in the main-pressing step performed after the pre-pressing step. That is, the second pressing of the second adhesive layer 520 maintains the second adhesive layer 520 having the second thickness T2 and the third pressing of the second adhesive layer 520 maintains the second adhesive layer 520 having the second thickness T2. Accordingly, after the main-pressing step, the second adhesive layer 520 may have a substantially uniform thickness. Accordingly, the connection failure between the first pad part 170 and the lead part 220 due to the massing of the conductive balls 414 or the connection failure between the second pad part 180 and the bump part 320 due to the massing of the conductive balls 424 may be prevented or reduced. Accordingly, the reliability of the display device 10 may be improved.

In an embodiment, the circuit board 200 may be attached on the display panel 100 after the driving circuit chip 300 is attached. That is, the driving circuit chip 300 may be placed on the second conductive film 420, and the driving circuit chip 300 may be main-pressed with the first pressure using the pressing device 820 to electrically connecting the second pad part 180 and the bump part 320. Subsequently, the circuit board 200 may be placed on the first conductive film 410, and the circuit board 200 may be main-pressed with the first pressure using the pressing device 830 to electrically connecting the first pad part 170 and the lead part 220.

In an embodiment, the circuit board 200 may be substantially simultaneously (or concurrently) attached on the display panel 100 with the driving circuit chip 300.

Figure 14:
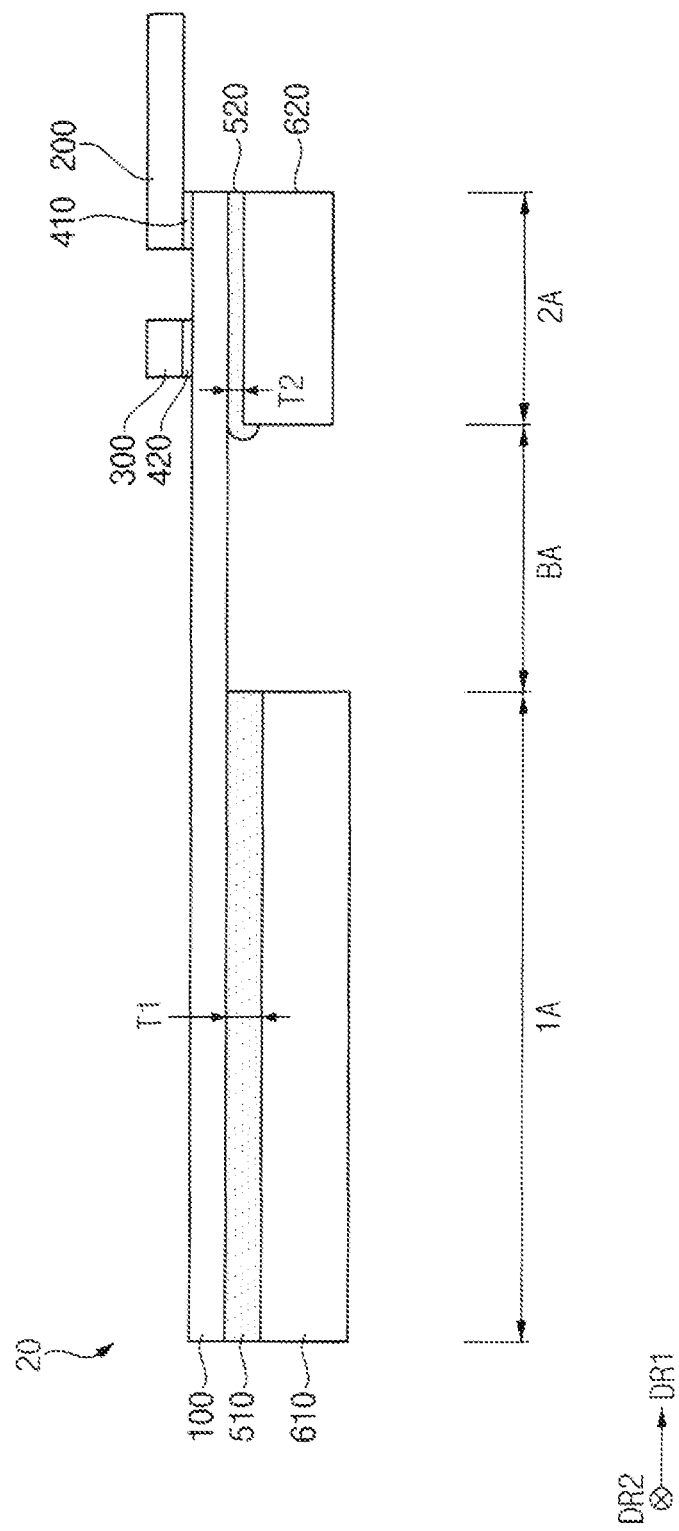
Figure 15:
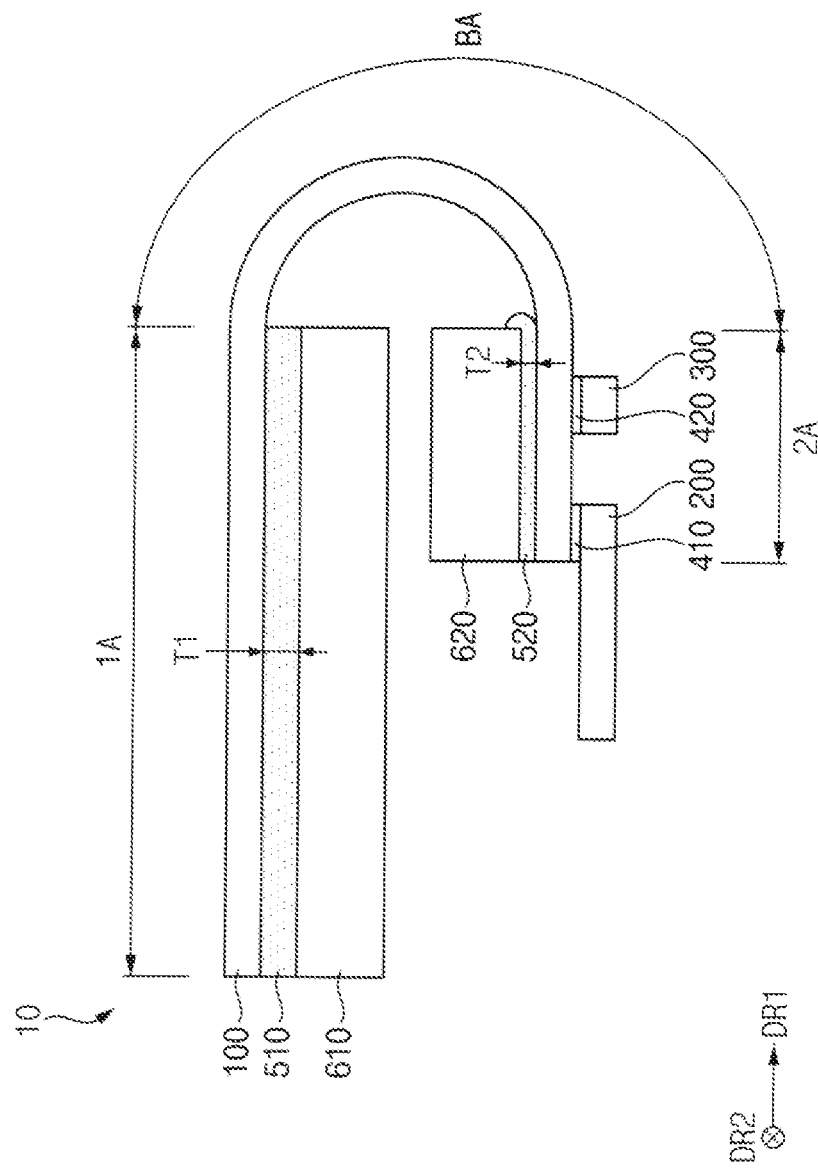

Referring to FIGS. 14 and 15, the third lower film 630 and the third adhesive layer 530 may be separated from the first lower film 610 and the second lower film 620 to define the display module 20 having the circuit board 200 and the driving circuit chip 300 attached to the display panel 100 at the distal end thereof. The display device 10 (and the display panel 100) may be bendable at the bending area BA. The display panel 100 may be bent at the bending area BA. The bending area BA of the display panel 100 may be bent along the bending axis extending in the second direction DR2.

In embodiments, the method of manufacturing or providing the display device 10 may include the pre-pressing step performed before the main-pressing step. In the pre-pressing step, the second pressure equal to or greater than the first pressure applied to the display module 20 in the main-pressing step and the heat having the second temperature equal to or greater than the first temperature applied to the display module 20 in the main-pressing step may be applied to the display module 20. Accordingly, the second adhesive layer 520 pre-deformed to have the second thickness T2 by the pre-pressing step may be hardly deformed even when the first pressure and heat having the first temperature are applied in the main-pressing step performed after the pre-pressing step. Accordingly, after the main-pressing step, the second adhesive layer 520 may have a substantially uniform thickness. Accordingly, the connection failure between the first pad part 170 and the lead part 220 due to the massing of the conductive balls 414 or the connection failure between the second pad part 180 and the bump part 320 due to the massing of the conductive balls 424 may be prevented or reduced. Accordingly, the reliability of the display device 10 may be improved.

In embodiments, as the second adhesive layer 520 is pre-deformed after the pre-pressing step (e.g., before the circuit board 200 is attached to the display panel 100), a portion of the second adhesive layer 520 may protrude outwardly from the second lower film 620. Accordingly, the protrusion of the second adhesive layer 520 may be easily removed since the circuit board 200 is not attached to the display panel 100. Accordingly, the defect of the display device 10 due to the protrusion may be prevented or reduced. Accordingly, the reliability of the display device 10 may be improved.

In embodiments, the driving circuit chip 300 may be placed on the second conductive film 420 such that the bump part 320 overlaps the second pad part 180 in consideration of the elongation of the display panel 100 by the pre-pressing step. In addition, the circuit board 200 may be placed on the first conductive film 410 such that the lead part 220 overlaps the first pad part 170 in consideration of the elongation of the display panel 100 by the pre-pressing step. That is, each of the driving circuit chip 300 and the circuit board 200 may be attached on the display panel 100 to be more precisely aligned. Accordingly, a connection failure between the first pad part 170 and the lead part 220 due to misalignment between the first pad part 170 and the lead part 220 or a connection failure between the second pad part 180 and the bump part 320 due to misalignment between the second pad part 180 and the bump part 320 may be prevented or reduced. Accordingly, the reliability of the display device 10 may be improved.

Figure 16:
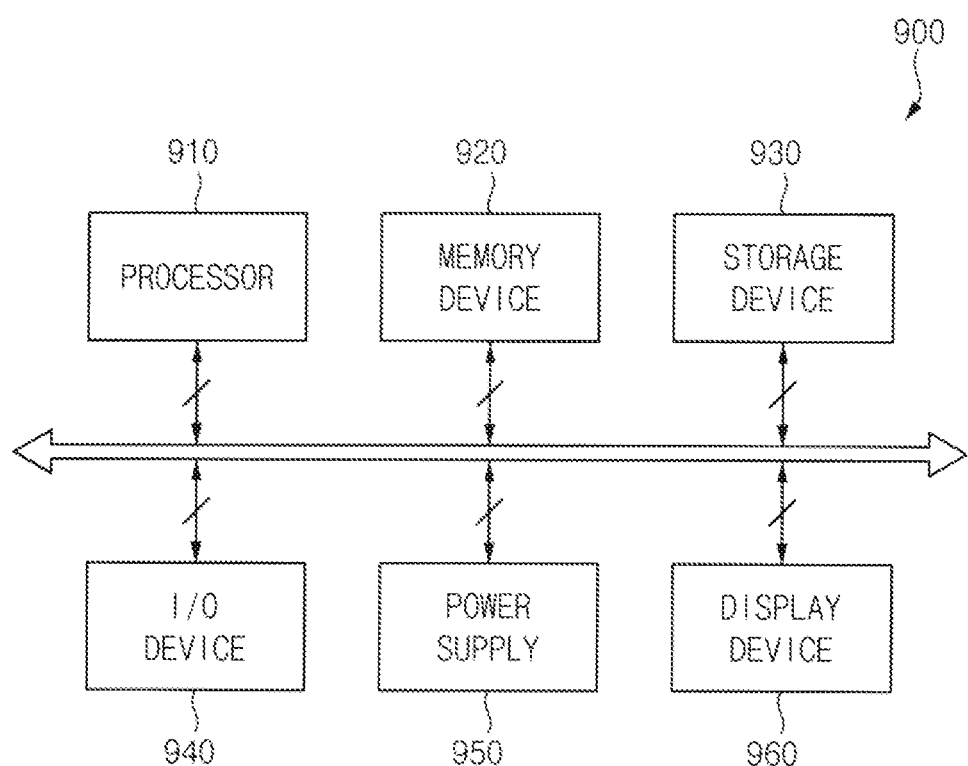
FIG. 16 is a block diagram illustrating an embodiment of an electronic device including the display device of FIG. 1.
Figure 17:
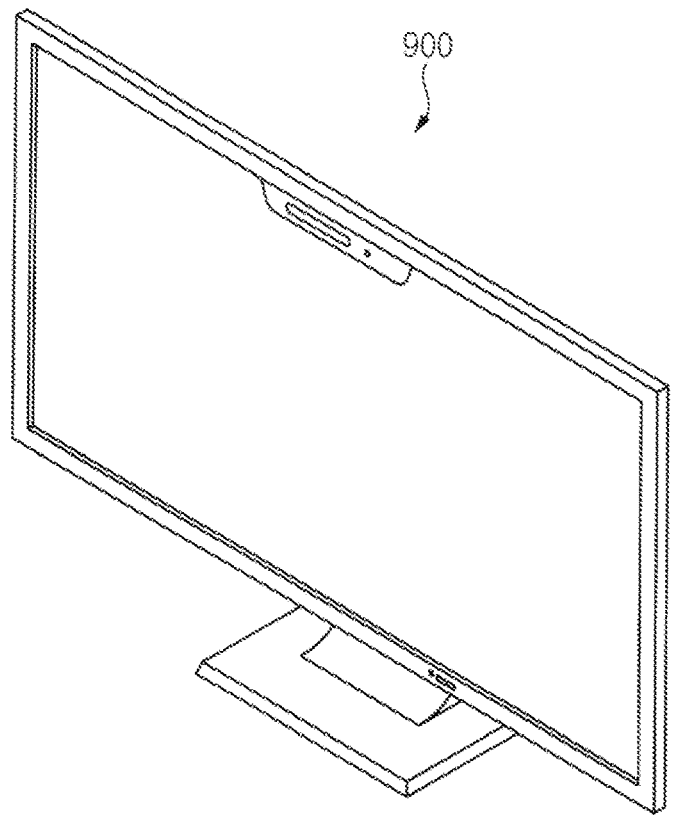
FIG. 17 is a diagram illustrating an embodiment of the electronic device of FIG. 16 which is implemented as a television.
Figure 18:
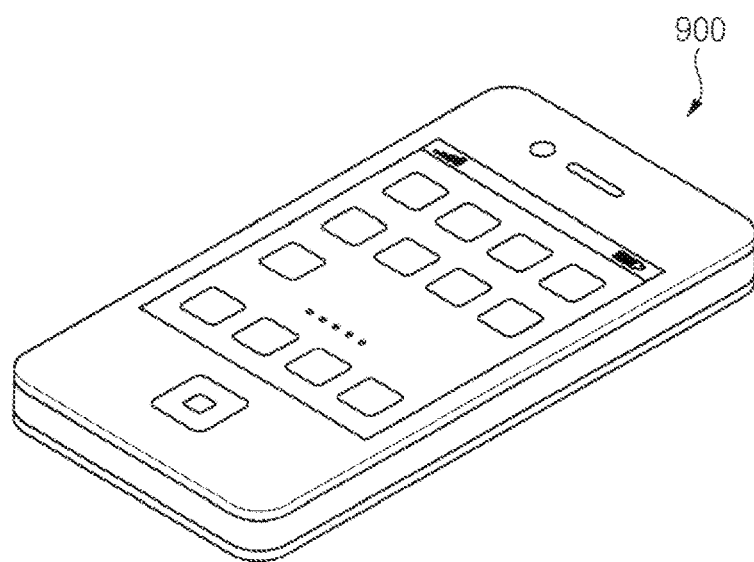
FIG. 18 is a diagram illustrating an embodiment of the electronic device of FIG. 16 which is implemented as a smart phone.

FIG. 16 is a block diagram illustrating an embodiment of an electronic device 900. FIG. 17 is a diagram illustrating an example in which the electronic device 900 of FIG. 16 is implemented as a television. FIG. 18 is a diagram illustrating an example in which the electronic device 900 of FIG. 16 is implemented as a smart phone.

Referring to FIGS. 16 to 18, in an embodiment, an electronic device 900 may include a processor 910, a memory device 920, a storage device 930, an input/output ("I/O") device 940, a power supply 950, and a display device 960. Here, the display device 960 may correspond to one or more embodiment of the display device 10 described with reference to FIGS. 1 to 9. The electronic device 900 may further include a plurality of ports for communicating with a video card, a sound card, a memory card, a universal serial bus ("USB") device, or the like. In an embodiment, as illustrated in FIG. 17, the electronic device 900 may be implemented as a television. In an embodiment, as illustrated in FIG. 18, the electronic device 900 may be implemented as a smart phone. However, embodiments are not limited thereto, and the electronic device 900 may be implemented as a cellular phone, a video phone, a smart pad, a smart watch, a tablet personal computer ("PC"), a car navigation system, a computer monitor, a laptop, a head disposed (e.g., mounted) display ("HMD"), or the like.

The processor 910 may perform various computing functions. In an embodiment, the processor 910 may be a microprocessor, a central processing unit ("CPU"), an application processor ("AP"), or the like. The processor 910 may be coupled to other components via an address bus, a control bus, a data bus, or the like. In an embodiment, the processor 910 may be coupled to an extended bus such as a peripheral component interconnection ("PCI") bus.

The memory device 920 may store data for operations of the electronic device 900. In an embodiment, the memory device 920 may include at least one non-volatile memory device such as an erasable programmable read-only memory ("EPROM") device, an electrically erasable programmable read-only memory ("EEPROM") device, a flash memory device, a phase change random access memory ("PRAM") device, a resistance random access memory ("RRAM") device, a nano floating gate memory ("NFGM") device, a polymer random access memory ("PoRAM") device, a magnetic random access memory ("MRAM") device, a ferroelectric random access memory ("FRAM") device, or the like, and/or at least one volatile memory device such as a dynamic random access memory ("DRAM") device, a static random access memory ("SRAM") device, a mobile DRAM device, or the like.

In an embodiment, the storage device 930 may include a solid state drive ("SSD") device, a hard disk drive ("HDD") device, a CD-ROM device, or the like. In an embodiment, the I/O device 940 may include an input device such as a keyboard, a keypad, a mouse device, a touchpad, a touch-screen, or the like, and an output device such as a printer, a speaker, or the like. The power supply 950 may provide power for operations of the electronic device 900. The display device 960 may be coupled to other components via the buses or other communication links. In an embodiment, the display device 960 may be included in the I/O device 940.

Although embodiments and implementations have been described herein, other embodiments and modifications will be apparent from this description. Accordingly, the invention are not limited to such embodiments, but rather to the broader scope of the appended claims and various obvious modifications and equivalent arrangements as would be apparent to a person of ordinary skill in the art.

What is claimed is:

1. A display device comprising:
a display panel including a display area, and a pad area including a first pad part;
a circuit board which is connected to the display panel at the pad area and overlaps the first pad part of the pad area in a thickness direction of the display panel;
a first conductive film which is between the display panel and the circuit board and electrically connects the first pad part of the pad area and the circuit board to each other;
a first lower film attached to the display panel at the display area;
a second lower film attached to the display panel at the pad area;
a first adhesive layer which attaches the first lower film to the display panel at the display area, the first adhesive layer having a first thickness in the thickness direction;
a second adhesive layer which attaches the second lower film to the display panel at the pad area and is spaced apart from the first adhesive layer in a direction along the display panel, a portion of the second adhesive layer which is between the second lower film and the display panel having a second thickness in the thickness direction which is less than the first thickness,
wherein
the second lower film includes a first side surface adjacent to the first lower film and a second side surface which is opposite to the first side surface,
the second adhesive layer has a side surface coplanar with the second side surface of the second lower film,
the second adhesive layer continuously extends in the direction along the display panel from the portion having the second thickness, toward the first adhesive layer, and further than thea first side surface of the second lower film to define a protrusion of the second adhesive layer, and along the thickness direction, the protrusion extends along the first side surface of the second lower film from the portion having the second thickness and only in a direction away from the display panel.

2. The display device of claim 1, wherein the portion of the second adhesive layer which is between the second lower film and the display panel has a uniform thickness.

3. The display device of claim 1, wherein the second adhesive layer includes the same material as the first adhesive layer.

4. The display device of claim 1, wherein
the second lower film is spaced apart from the first lower film in the direction along the display panel, and
the second adhesive layer includes:
a first side surface adjacent to the first adhesive layer, and
a second side surface which is opposite to the first side surface of the second adhesive layer, the second side surface of the second adhesive layer defining the side surface coplanar with the second side surface of the second lower film.

5. The display device of claim 4, wherein the protrusion defines the first side surface of the second adhesive layer spaced apart from the first side surface of the second lower film.

6. The display device of claim 5, wherein the first side surface of the second adhesive layer is curved.

7. The display device of claim 4, wherein the second side surface of the second adhesive layer is flat.

8. The display device of claim 1, further comprising:
the pad area of the display panel further including a second pad part which is spaced apart from the first pad part,
a driving circuit chip connected to the display panel at the pad area, the driving circuit chip spaced apart from the circuit board and overlapping the second pad part of the pad area; and
a second conductive film which is between the display panel and the driving circuit chip and electrically connects the second pad part of the pad area and the driving circuit chip to each other.

9. An electronic device comprising:
a display device including:
a display panel including a display area, and a pad area including a first pad part;
a circuit board which is connected to the display panel at the pad area and overlaps the first pad part of the pad area in a thickness direction of the display panel;
a first conductive film which is between the display panel and the circuit board and electrically connects the first pad part of the pad area and the circuit board to each other;
a first lower film attached to the display panel at the display area;
a second lower film attached to the display panel at the pad area;
a first adhesive layer which attaches the first lower film to the display panel at the display area, the first adhesive layer having a first thickness in the thickness direction; and
a second adhesive layer which attaches the second lower film to the display panel at the pad area and is spaced apart from the first adhesive layer in a direction along the display panel, a portion of the second adhesive layer which is between the second lower film and the display panel having a second thickness in the thickness direction which is less than the first thickness; and
a power supply configured to provide power to the display device,
wherein
the second lower film includes a first side surface adjacent to the first lower film and a second side surface which is opposite to the first side surface,
the second adhesive layer has a side surface coplanar with the second side surface of the second lower film,
the second adhesive layer continuously extends in the direction along the display panel from the portion having the second thickness, toward the first adhesive layer, and further than the first side surface of the second lower film to define a protrusion of the second adhesive layer, and
along the thickness direction, the protrusion extends along the first side surface of the second lower film from the portion having the second thickness and only in a direction away from the display panel.

* * * * *